United States Patent
Sugino et al.

(10) Patent No.: US 10,790,706 B2
(45) Date of Patent: Sep. 29, 2020

(54) WIRELESS POWER TRANSMISSION APPARATUS, CONVEYANCE SYSTEM EMPLOYING THE APPARATUS AND METHOD OF CONTROLLING THE APPARATUS

(71) Applicants: DENSO CORPORATION, Kariya, Aichi-pref. (JP); National University Corporation Toyohashi University of Technology, Toyohashi-shi, Aichi (JP)

(72) Inventors: Masayoshi Sugino, Kariya (JP); Takashi Ohira, Toyohashi (JP); Naoki Sakai, Toyohashi (JP); Satoshi Kitabayashi, Toyohashi (JP); Motoaki Miyazaki, Toyohashi (JP)

(73) Assignees: DENSO CORPORATION, Kariya, Aichi-pref. (JP); National University Corporation Toyohashi University of Technology, Toyohashi-Shi, Aichi (JP)

( * ) Notice: Subject to any disclaimer, the term of this patent is extended or adjusted under 35 U.S.C. 154(b) by 181 days.

(21) Appl. No.: 16/145,521

(22) Filed: Sep. 28, 2018

(65) Prior Publication Data
US 2019/0103769 A1    Apr. 4, 2019

(30) Foreign Application Priority Data

Sep. 29, 2017    (JP) ................ 2017-190771

(51) Int. Cl.
*H02J 50/20* (2016.01)
*B65G 43/00* (2006.01)
(Continued)

(52) U.S. Cl.
CPC .............. *H02J 50/20* (2016.02); *B65G 43/00* (2013.01); *H02J 50/40* (2016.02); *H03H 11/28* (2013.01); *H03H 7/38* (2013.01)

(58) Field of Classification Search
CPC .. H02J 50/20; H02J 50/90; H02J 50/10; H02J 50/40; B65G 43/00; H03H 11/28; H03H 7/38
See application file for complete search history.

(56) References Cited

U.S. PATENT DOCUMENTS

2015/0200568 A1    7/2015 Takei

OTHER PUBLICATIONS

Shoichi Sato et al., *A Real-Time Load Tracking Circuit for Automatic Impedance Matching*, Electronic Information Communication Society Article Journal of 2014, 12 vol. J97 C No. 12.

*Primary Examiner* — Robert L Deberadinis
(74) *Attorney, Agent, or Firm* — Harness, Dickey & Pierce, P.L.C.

(57) ABSTRACT

A wireless power transmission apparatus includes a high-frequency power generator, a power-transmitting electrode, a plurality of power-receiving electrodes, a switchable matching device, a detection circuit and a controller. The high-frequency power generator generates high-frequency power. The power-transmitting electrode is configured to transmit the high-frequency power generated by the high-frequency power generator. Each of the power-receiving electrodes is capable of wirelessly receiving the high-frequency power from the power-transmitting electrode. The matching device is electrically connected with the power-transmitting electrode and includes one or more matching circuits. The detection circuit detects, based on the output of reflected power from the power-transmitting electrode, whether or not the generation of the high-frequency power by the high-frequency power generator and the transmission of the high-frequency power at the power-transmitting electrode match each other. The controller switches the one or more matching circuits of the matching device depending on the detection result of the detection circuit.

5 Claims, 6 Drawing Sheets

(51) Int. Cl.
*H02J 50/40* (2016.01)
*H03H 11/28* (2006.01)
*H03H 7/38* (2006.01)

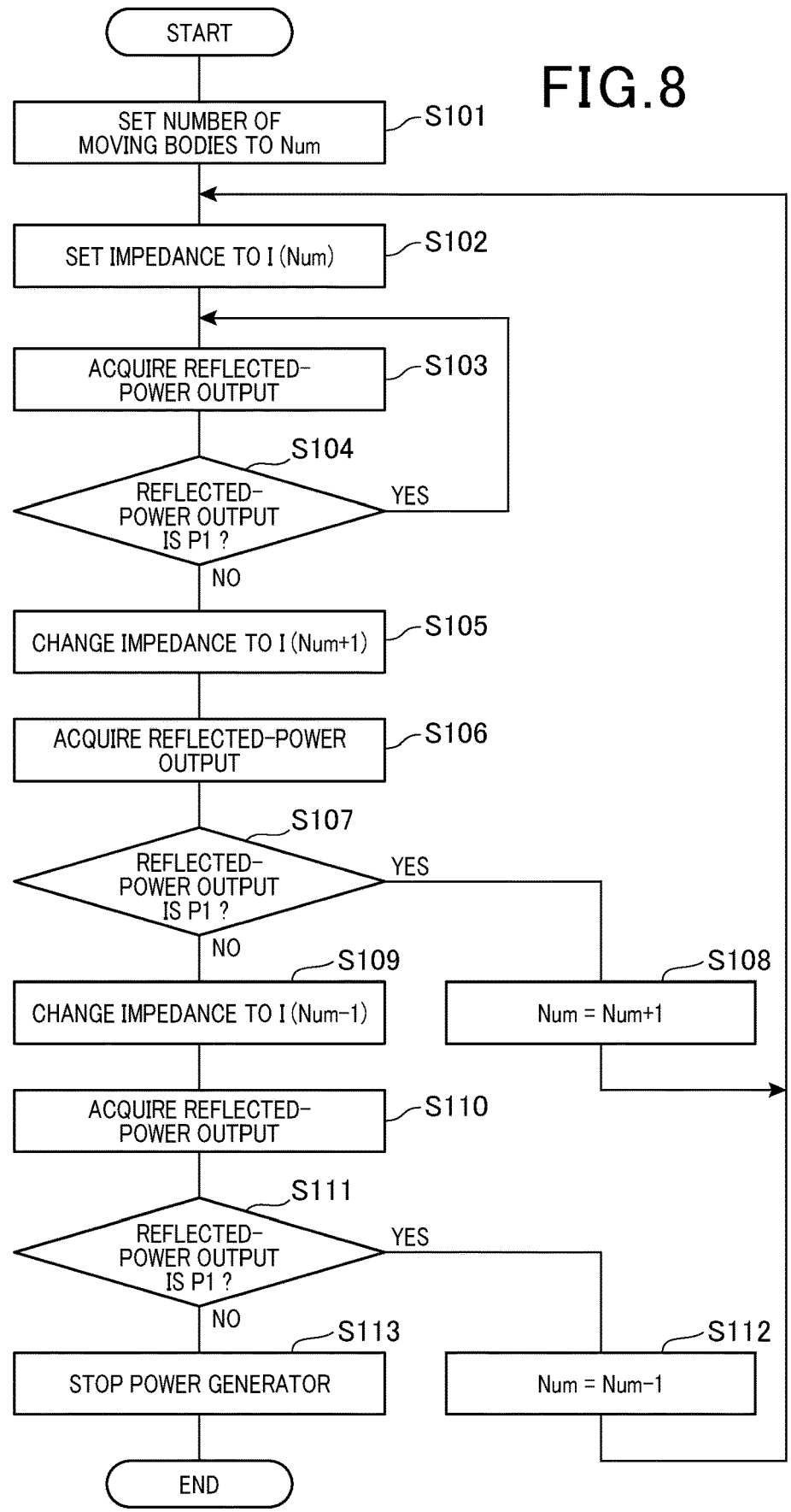

WIRELESS POWER TRANSMISSION APPARATUS, CONVEYANCE SYSTEM EMPLOYING THE APPARATUS AND METHOD OF CONTROLLING THE APPARATUS

CROSS-REFERENCE TO RELATED APPLICATION

This application is based on and claims priority from Japanese Patent Application No. 2017-190771 filed on Sep. 29, 2017, the contents of which are hereby incorporated by reference in its entirety into this application.

BACKGROUND

1 Technical Field

The present invention relates to wireless power transmission apparatuses, conveyance systems that employ the wireless power transmission apparatuses and methods of controlling the wireless power transmission apparatuses.

2 Description of Related Art

There are known various wireless power transmission apparatuses (or wireless power supply apparatuses) that transmit (or supply) electric power without wires as a physical link (see, for example, International Publication No. WO2014002190A1). Among them, in those wireless power transmission apparatuses which utilize electric field resonance, matching between the power transmission and the power reception has a great effect on the power transmission efficiency.

Specifically, in the case where the number of power-receiving electrodes actually receiving electric power from power-transmitting electrodes is constant, it is possible to set a matching circuit according to the nwnher of the power-receiving electrodes, thereby maximizing the power transmission efficiency (i.e., the efficiency of the wireless power transmission from the power-transmitting electrodes to the power-receiving electrodes).

On the other hand, in the case where there are a plurality of objects each of which has a given number of power-receiving electrodes provided therein for receiving electric power from the power-transmitting electrodes, if the number of the objects having the respective power-receiving electrodes actually receiving electric power from the power-transmitting electrodes varies, the variation in the number of the objects results in variation in the matching between the power transmission by the power-transmitting electrodes and the power reception by the power-receiving electrodes.

Therefore, in the case where the number of the objects having the respective power-receiving electrodes actually receiving electric power from the power-transmitting electrodes varies, it is necessary to: (1) detect the numberof the power-receiving electrodes actually receiving electric power from the power-transmitting electrodes; and (2) control the matching circuit according to the detected number of the power-receiving electrodes.

Moreover, to detect the number of the power-receiving electrodes actually receiving electric power from the power-transmitting electrodes, one may consider arranging optical detection devices on both the side where the objects enter a power-receiving region and the side where the objects exit the power-receiving region and thereby detecting the number of the objects having the respective power-receiving electrodes actually receiving electric power from the power-transmitting electrodes. Here, the power-receiving region denotes a region where the power-receiving electrodes provided in the objects are actually opposed to and receive electric power from the power-transmitting electrodes. However, in this case, it would be necessary to provide both a special entrance via which the objects enter the power-receiving region and a special exit via which the objects exit the power-receiving region. Moreover, when devices or objects which have no power-receiving electrodes provided therein enter the power-receiving region, these devices or objects might be erroneously detected by the optical detection devices as the objects having the respective power-receiving electrodes actually receiving electric power from the power-transmitting electrodes. Consequently, it might become impossible to accurately detect the number of the objects having the respective power-receiving electrodes actually receiving electric power from the power-transmitting electrodes. As a result, it might become impossible to suitably control the matching circuit, resulting in a decrease in the power transmission efficiency.

SUMMARY

According to one exemplary embodiment, there is provided a wireless power transmission apparatus which includes a high-frequency power generator, a power-transmitting electrode, a plurality of power-receiving electrodes, a switchable matching device, a detection circuit and a controller. The high-frequency power generator is configured to generate high-frequency power. The power-transmitting electrode is configured to transmit the high-frequency power generated by the high-frequency power generator. Each of the power-receiving electrodes is capable of being opposed to the power-transmitting electrode and wirelessly receiving the high-frequency power from the power-transmitting electrode via electric field coupling using capacitance between the power-transmitting electrode and the power-receiving electrode. The switchable matching device is electrically connected with the power-transmitting electrode and includes one or more matching circuits. The detection circuit is electrically connected between the high-frequency power generator and the switchable matching device to detect, based on output of reflected power from the power-transmitting electrode, whether or not the generation of the high-frequency power by the high-frequency power generator and the transmission of the high-frequency power at the power-transmitting electrode match each other. The reflected power is that part of the high-frequency power which is not transmitted from the power-transmitting electrode to the power-receiving electrodes and returns from the power-transmitting electrode to the high-frequency power generator side. The output of the reflected power from the power-transmitting electrode depends on the number of the power-receiving electrodes actually opposed to and receiving the high-frequency power from the power-transmitting electrode. The controller controls, at least, operation of the high-frequency power generator and the switchable matching device. The controller switches the one or more matching circuits of the switchable matching device depending on the detection result of the detection circuit.

With the above configuration, when the generation of the high-frequency power by the high-frequency power generator and the transmission of the high-frequency power at the power-transmitting electrode match each other, the controller determines that the one or more matching circuits of the switchable matching device are suitably set; thus the controller maintains the current setting of the one or more matching circuits of the switchable matching device. In contrast, when the generation of the high-frequency power by the high-frequency power generator and the transmission of the high-frequency power at the power-transmitting electrode do not match each other, the controller determines that the one or more matching circuits of the switchable matching device are unsuitably set; thus, the controller switches the one or more matching circuits of the switchable matching device to have the generation of the high-frequency power by the high-frequency power generator and the transmission of the high-frequence power at the power-transmitting electrode match each other. Consequently, it becomes possible to realize, without employing optical detection devices, automatic matching between the generation of the high-frequency power by the high-frequency power generator and the transmission of the high-frequency power at the power-transmitting electrode (or automatic matching between the impedance of the switchable matching device and the number of the power-receiving electrodes actually receiving the high-frequency power from the power-transmitting electrode), thereby improving the efficiency of the wireless power transmission from the power-transmitting electrode to the power-receiving electrodes.

BRIEF DESCRIPTION OF THE DRAWINGS

The present invention will be understood more fully from the detailed description given hereinafter and from the accompanying drawings of one exemplary embodiment, which, however, should not be taken to limit the present invention to the specific embodiment but are for the purpose of explanation and understanding only.

In the accompanying drawings:

FIG. 8 is a flowchart illustrating a process performed by a controller of the wireless power transmission apparatus for controlling the switchable matching device.

DESCRIPTION OF EMBODIMENT

Figure 1:
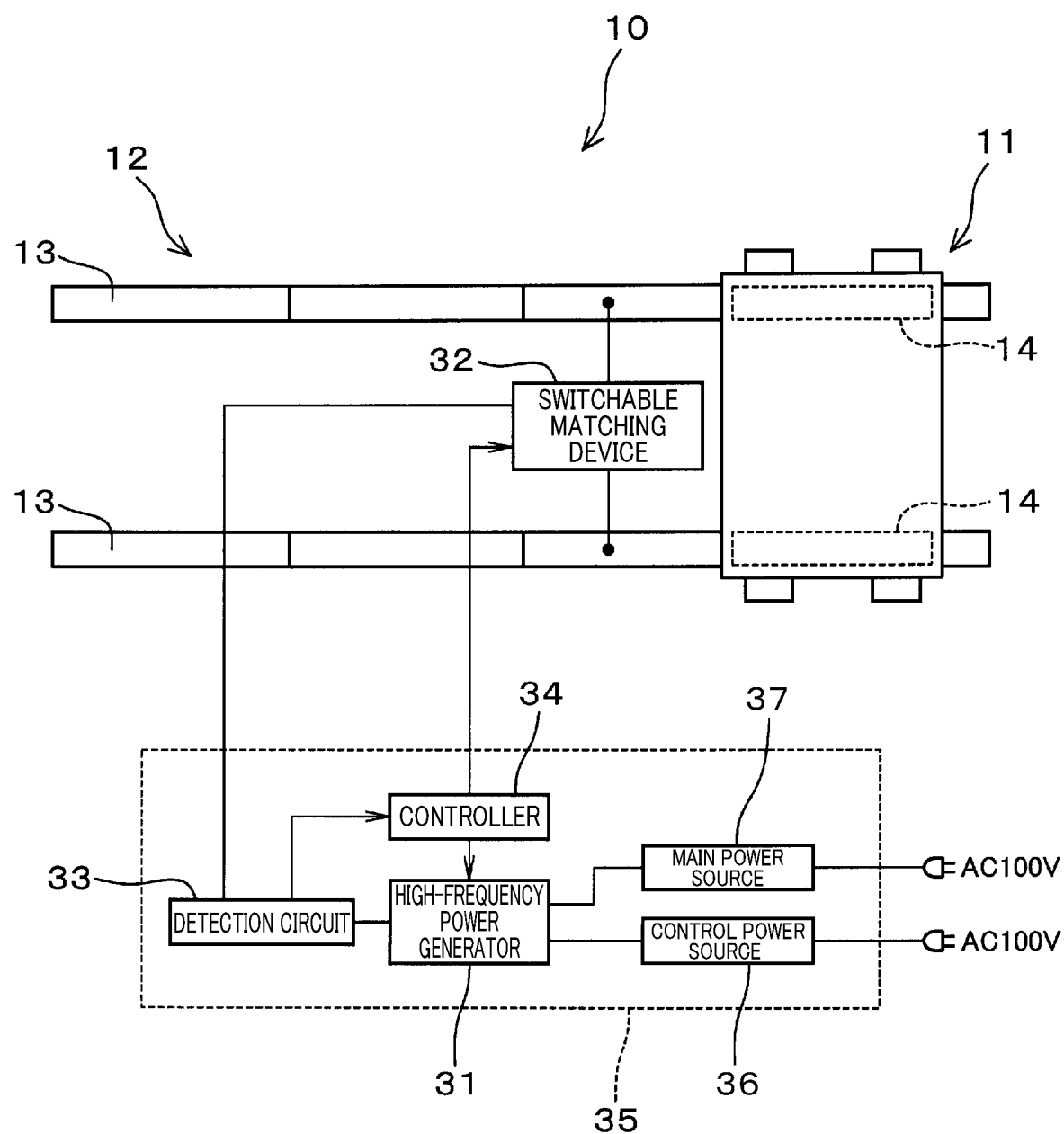
FIG. 1 is a schematic block diagram illustrating the configuration of a wireless power transmission apparatus according to the exemplary embodiment.
Figure 2:
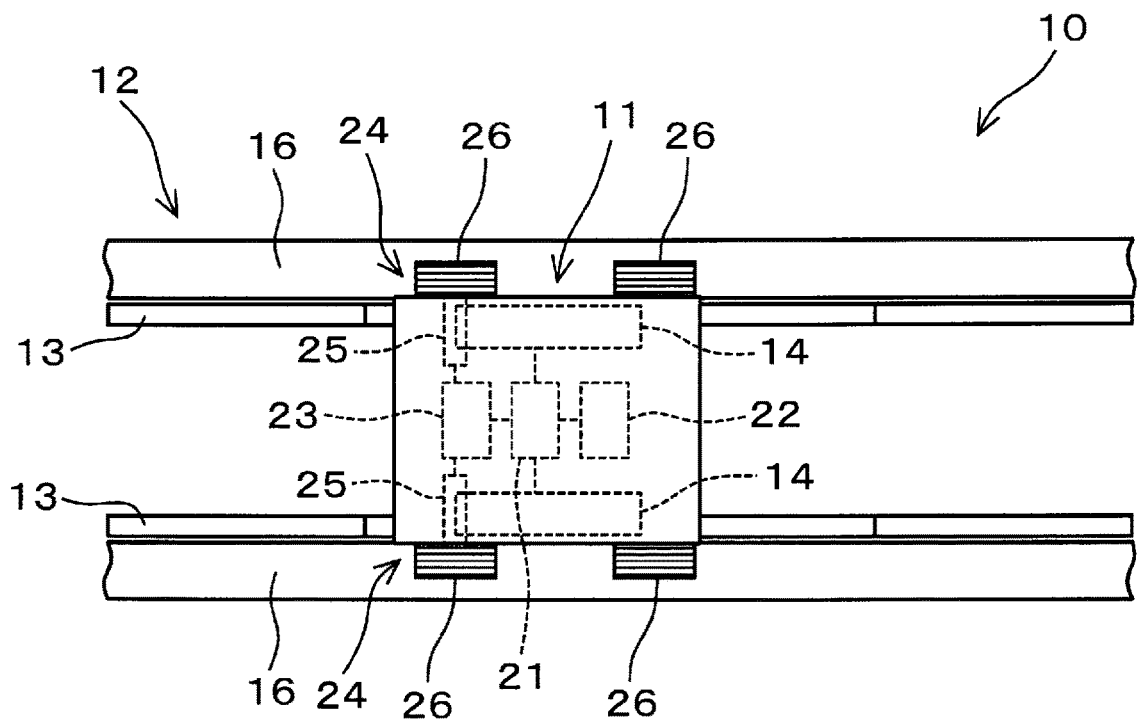
FIG. 2 is a schematic plan view of a conveyance system which employs the wireless power transmission apparatus.
Figure 3:
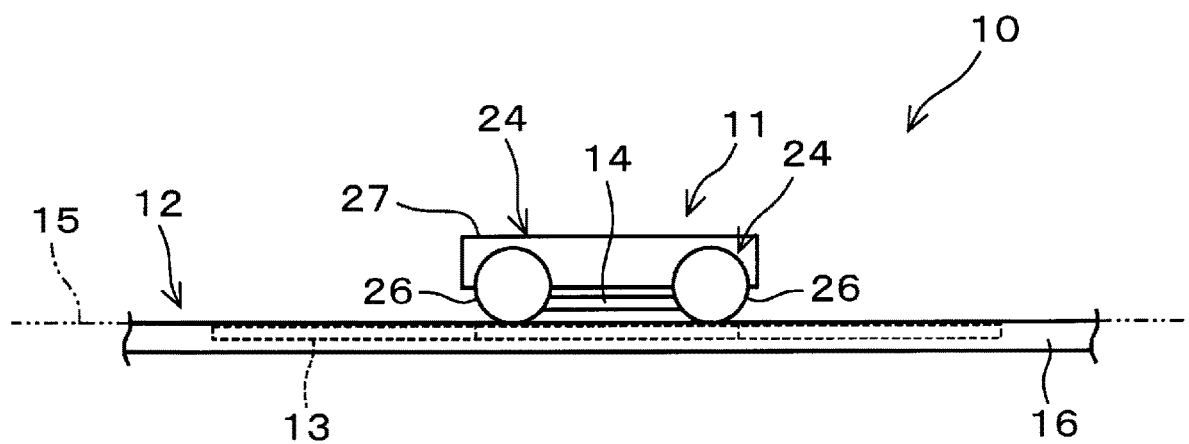
FIG. 3 is a schematic side view of the conveyance system.

FIG. 1 shows the configuration of a wireless power transmission apparatus (or wireless power supply apparatus) 12 according to an exemplary embodiment. FIGS. 2 and 3 show the configuration of a conveyance system 10 which includes the wireless power transmission apparatus 12.

The conveyance system 10 further includes a plurality of moving bodies 11 in addition to the wireless power transmission apparatus 12.

The wireless power transmission apparatus 12 includes a pair of power-transmitting electrodes 13 and a plurality of pairs of power-receiving electrodes 14.

In addition, it should be noted that for the sake of simplicity, only one of the plurality of moving bodies 11 and only one of the plurality of pairs of power-receiving electrodes 14 are shown in FIGS. 1-3.

The wireless power transmission apparatus 12 is installed in a facility 15 (e.g., a factory or warehouse) in which the conveyance system 10 is used. In the facility 15 (see FIG. 3), there is provided a track 16 along which the moving bodies 11 move.

Specifically, the pair of power-transmitting electrodes 13 of the wireless power transmission apparatus 12 is provided in part of the track 16. On the other hand, each of the plurality of pairs of power-receiving electrodes 14 is provided in a corresponding one of the moving bodies 11. In other words, in each of the moving bodies 11, there is provided one pair of power-receiving electrodes 14.

As shown in FIGS. 2 and 3, in each of the moving bodies 11, there are also provided, in addition to the power-receiving electrodes 14, a rectifier circuit 21, a battery 22, a controller 23 and a driving unit 24.

Specifically, in each of the moving bodies 11, the power-receiving electrodes 14 are provided so as to be brought into a power-receiving region during the moving of the moving body 11 along the track 16. In the power-receiving region, the power-receiving electrodes 14 are respectively opposed to and receive high-frequency power from the power-transmitting electrodes 13.

The rectifier circuit 21 is configured to rectify the high-frequency power received by the power-receiving electrodes 14 into DC power.

The battery 22 is implemented by, for example, a secondary battery such as a lithium-ion battery. The battery 22 stores the DC power outputted from the rectifier circuit 21.

The controller 23 controls the charging of the battery 22 with the DC power. The controller 23 also controls the generation of a driving force in the driving unit 24.

The driving unit 24 includes at least one motor 25 (e.g., two motors 25 as shown in FIG. 2) and a plurality of wheels 26. The at least one motor 25 is energized by the DC power supplied from the rectifier circuit 21 or the battery 22 to generate the driving force (or torque), thereby driving the wheels 26 to rotate. Moreover, with the rotation of the wheels 26, the moving body 11 moves along the track 16.

In addition, as shown in FIG. 3, on an end surface of the moving body 11 on the opposite side to the power-transmitting electrodes 13, there is provided a tray 27 for carrying a load.

In the present embodiment, the length of each of the power-transmitting electrodes 13 is set to be greater than the length of each of the moving bodies 11. Consequently, it is possible for the power-receiving electrodes 14 of two or more moving bodies 11 to receive the high-frequency power from the power-transmitting electrodes 13 at the same time.

In the present embodiment, the power-transmitting electrodes 13 of the wireless power transmission apparatus 12 are shaped as a pair of parallel rails. In addition, the power-transmitting electrodes 13 may be straight, curved or bent according to the structure of the facility 15.

The power-transmitting electrodes 13 are made, for example, of an electrically-conductive metal plate such as an aluminum plate, a copper plate or an iron plate. That is, the power-transmitting electrodes 13 are plate-shaped.

Similarly, the power-receiving electrodes 14 of the wireless power transmission apparatus 12 are also made, for example, of an electrically-conductive metal plate such as an aluminum plate, a copper plate or an iron plate. That is, the power-receiving electrodes 14 are also plate-shaped.

In each of the moving bodies 11, the power-receiving electrodes 14 are arranged so as to be respectively opposed to the power-transmitting electrodes 13 in a contactless manner with predetermined gaps formed between the power-transmitting electrodes 13 and the power-receiving electrodes 14.

Consequently, the predetermined gaps formed between the power-transmitting electrodes 13 and the power-receiving electrodes 14 are filled with air which is a. dielectric, thereby securing capacitances (or electrostatic capacities) between the power-transmitting electrodes 13 and the power-receiving electrodes 14. As a result, the high-frequency power is wirelessly transmitted (or supplied) from the power-transmitting electrodes 13 to the power-receiving electrodes 14 utilizing electric field coupling (or capacitive coupling).

As shown in FIG. 1, in the present embodiment, the wireless power transmission apparatus 12 further includes a high-frequency power generator 31, a switchable matching device 32. a detection circuit 33, a controller 34, a control board 35, a control power source 36 and a main power source 37 in addition to the power-transmitting electrodes 13 and the power-receiving electrodes 14.

The high-frequency power generator 31, the detection circuit 33 and the controller 34 are integrated into the control board 35.

The high-frequency power generator 31 is electrically connected to the power-transmitting electrodes 13 as well as to both the control power source 36 and the main power source 37. In the present embodiment, the high-frequency power generator 31 is configured with an E-class inverter. The high-frequency power generator 31 is controlled by electric power supplied from the control power source 36. The high-frequency power generator 31 generates the high-frequency power using electric power supplied from the main power source 37 and applies the generated high-frequency power to the power-transmitting electrodes 13.

In addition, it should be noted that: the configuration of the high-frequency power generator 31 is not limited to the E-class inverter; and the high-frequency power generator 31 may alternatively have any other configuration such that it can generate the high-frequency power.

Figure 4:
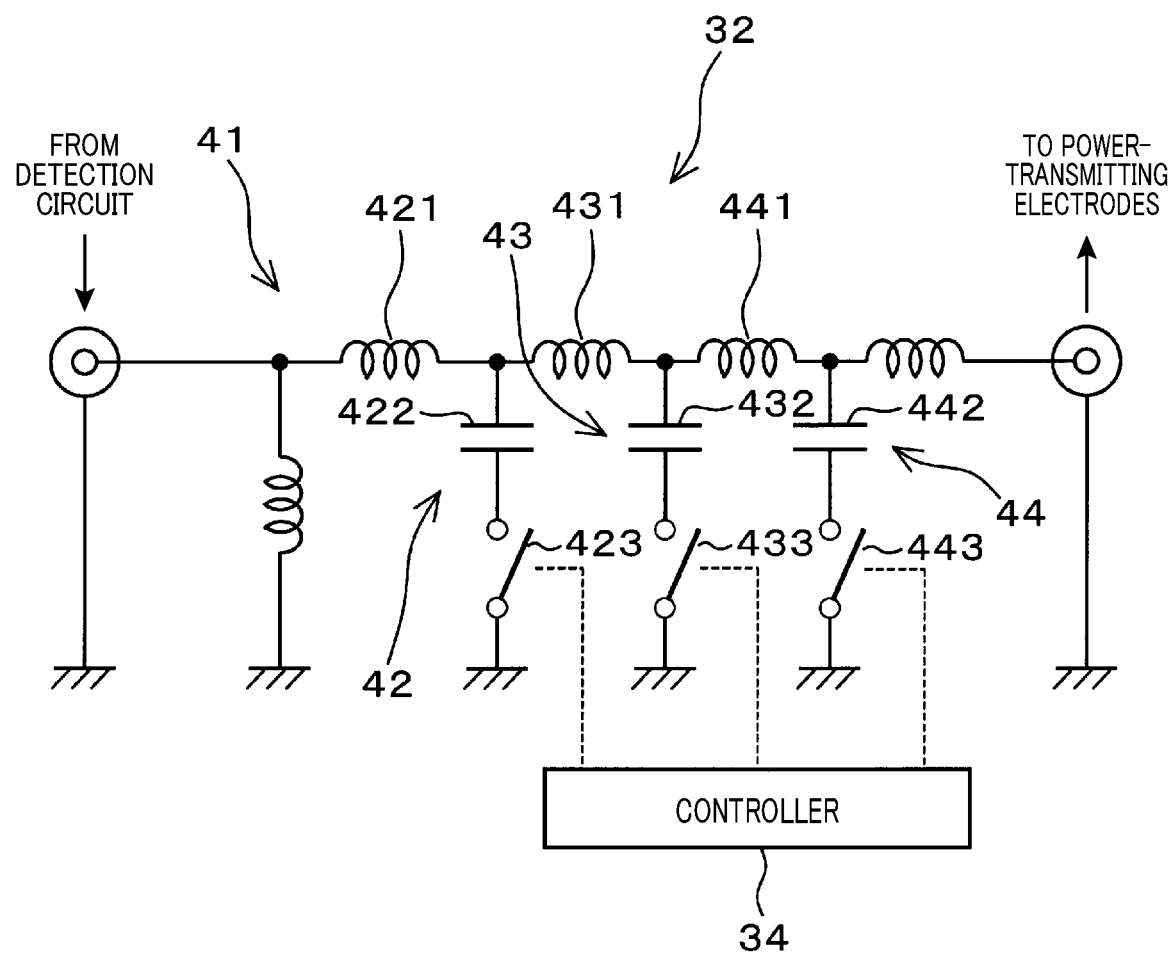
FIG. 4 is a schematic circuit diagram of a switchable matching device of the wireless power transmission apparatus.

The switchable matching device 32 is electrically connected with the power-transmitting electrodes 13. As shown in FIG. 4, the switchable matching device 32 includes a matching circuit group 41. The matching circuit group 41 is constituted of a plurality of matching circuits. Each of the matching circuits is an LC circuit which includes a coil and a capacitor and whose impedance is set to a predetermined value. The number of the matching circuits constituting the matching circuit group 41 is set according to the total number of the moving bodies 11 that move along the track 16 and each have one pair of the power-receiving electrodes 14 provided therein for receiving the high-frequency power from the power-transmitting electrodes 13.

More particularly, in the present embodiment, the total number of the moving bodies 11 is set to 4. Accordingly, the number of the matching circuits constituting the matching circuit group 41 is set to 3. That is, the switchable matching device 32 includes three matching circuits 42, 43 and 44. The matching circuit 42 includes a coil 421. a capacitor 422 and a switch 423. The matching circuit 43 includes a coil 431, a capacitor 432 and a switch 433. The matching circuit 44 includes a coil 441, a capacitor 442 and a switch 443.

It should be noted that though the three matching circuits 42-44 are identically depicted in FIG. 4 for the sake of simplicity, they actually have different sizes of the coils and the capacitors and thus have different impedances.

In addition, it also should be noted that the switches 423, 433 and 443 of the matching circuits 42-44 may be implemented by either mechanical switches or electronic switches.

The on/off switching of the switches 423, 433 and 443 of the matching circuits 42-44 is controlled by the controller 34, Specifically, when the number of the moving bodies 11 having the respective power-receiving electrodes 14 actually opposed to and receiving the high-frequency power from the power-transmitting electrodes 13 is equal to 1, all of the switches 423, 433 and 443 of the matching circuits 42-44 are turned off by the controller 34. In contrast, when the number of the moving bodies 11 having the respective power-receiving electrodes 14 actually opposed to and receiving the high-frequency power from the power-transmitting electrodes 13 is equal to 2, the switch 423 of the matching circuit 42 is turned on by the controller 34. Moreover, when the number of the moving bodies 11 having the respective power-receiving electrodes 14 actually opposed to and receiving the high-frequency power from the power-transmitting electrodes 13 is equal to 3, the switch 433 of the matching circuit 43 is turned on by the controller 34. Furthermore, when the number of the moving bodies 11 having the respective power-receiving electrodes 14 actually opposed to and receiving the high-frequency power from the power-transmitting electrodes 13 is equal to 4, the switch 443 of the matching circuit 44 is turned on by the controller 34.

As above, the controller 34 changes, by controlling the on/off switching of the switches 423, 433 and 443 of the matching circuits 42-44, the impedance of the switchable matching device 32 according to the number of the moving bodies 11 having the respective power-receiving electrodes 14 actually opposed to and receiving the high-frequency power from the power-transmitting electrodes 13.

In addition, it should he noted that the number of the moving bodies 11, the number and the configuration of the matching circuits of the switchable matching device 32 and the manner of controlling the on/off switching of the switches of the matching circuits by the controller 34 are not limited to the above, but may be suitably changed.

As shown in FIG. 1, the detection circuit 33 is electrically connected between the high-frequency power generator 31 and the switchable matching device 32. The detection circuit 33 detects match or mismatch between the generation of the high-frequency power by the high-frequency power generator 31 and the transmission of the high-frequency power (or the high-frequency oscillation) at the power-transmitting electrodes 13. In other words, the detection circuit 33 detects whether or not the generation of the high-frequency power by the high-frequency power generator 31 and the transmission of the high-frequency power at the power-transmitting electrodes 13 match each other.

Specifically, in the present embodiment, the detection circuit 33 detects match or mismatch between the generation of the high-frequency power by the high-frequency power generator 31 and the transmission of the high-frequency power at the power-transmitting electrodes 13 on the basis of the output of reflected power from the power-transmitting electrodes 13. Here, the reflected power denotes that part of the high-frequency power which is not transmitted from the power-transmitting electrodes 13 to the power-receiving electrodes 14 and returns from the power-transmitting electrodes 13 to the high-frequency power generator 31 side. The output of the reflected power depends on the nut ber of the power-receiving electrodes 14 actually receiving the high-frequency power from the power-transmitting electrodes 13, i.e., depends on the number of the moving bodies 11 having the respective power-receiving electrodes 14 actually opposed to and receiving the high-frequency power from the power-transmitting electrodes 13.

Figure 5:
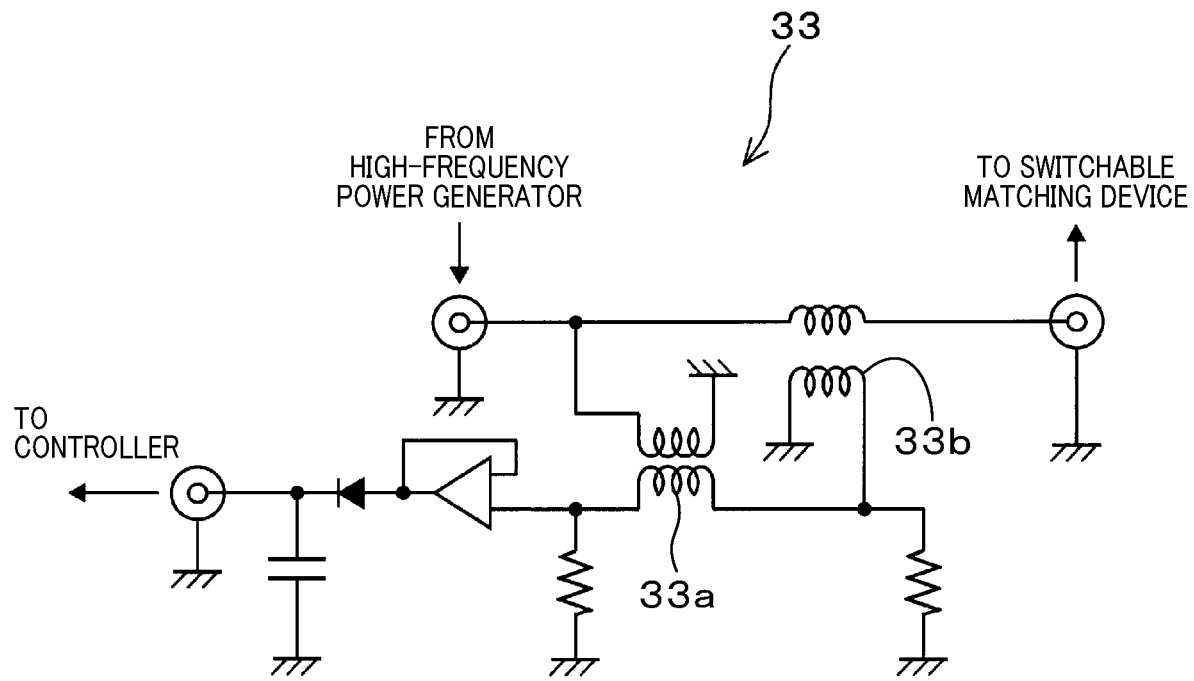
FIG. 5 is a schematic circuit diagram illustrating an example of configuring a detection circuit of the wireless power transmission apparatus.

In the present embodiment, the detection circuit 33 is configured as shown in FIG. 5. Specifically, the detection circuit 33 includes coils 33a for measuring the high-frequency voltage between the high-frequency power generator 31 and the switchable matching device 32 and coils 33b for measuring the high-frequency current flowing between the high-frequency power generator 31 and the switchable matching device 32, The detection circuit 33 determines the phase difference between the high-frequency voltage and the high-frequency current by synthesizing the output of the coils 33a and the output of the coils 33b and rectifying the result of the synthesization. Then, based on the determined phase difference, the detection circuit 33 further determines the output of the reflected power from the power-transmitting electrodes 13.

Figure 6:
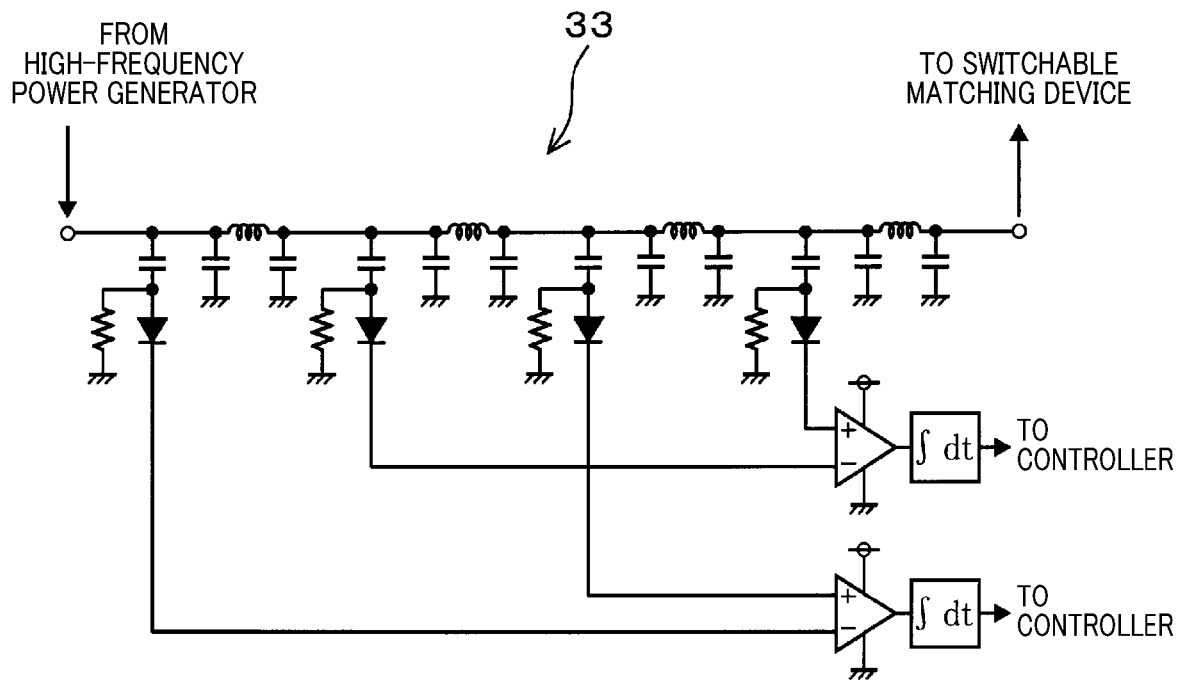
FIG. 6 is a schematic circuit diagram illustrating another example of configuring the detection circuit.

In addition, it should be noted that the detection circuit 33 may alternatively be configured as shown in FIG. 6.

Figure 7:
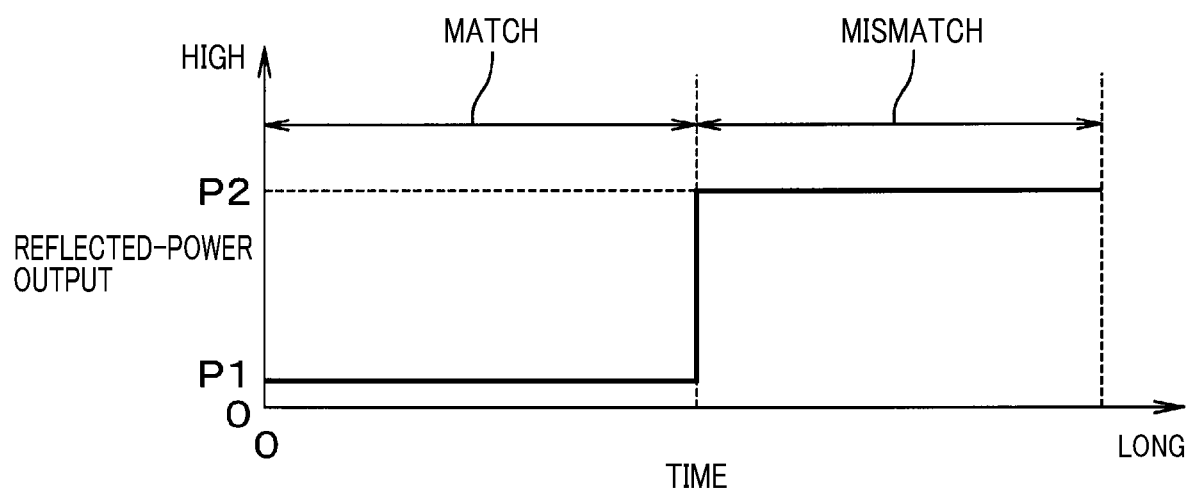
FIG. 7 is a graphical representation illustrating the output of reflected power from power-transmitting electrodes in the wireless power transmission apparatus, the output of the reflected power changing depending on whether there is match or mismatch between the generation of high-frequency power by a high-frequency power generator and the transmission of the high-frequency power at the power-transmitting electrodes in the wireless power transmission apparatus.

As shown in FIG. 7, the output of the reflected power from the power-transmitting electrodes 13 (hereinafter, to be simply referred to as the reflected-power output) changes depending on whether there is match or mismatch between the generation of the high-frequency power by the high-frequency power generator 31 and the transmission of the high-frequency power at the power-transmitting electrodes 13. Specifically, when the generation of the high-frequency power by the high-frequency power generator 31 and the transmission of the high-frequency power at the power-transmitting electrodes 13 match each other, the reflected-power output is equal to a low power P1. In contrast, when the generation of the high-frequency power by the high-frequency power generator 31 and the transmission of the high-frequency power at the power-transmitting electrodes 13 do not match each other, the reflected-power output is equal to a high power P2 (P2>P1).

More specifically, when the impedance of the switchable matching device 32 matches the number of the moving bodies 11 having the respective power-receiving electrodes 14 actually opposed to and receiving the high-frequency power from the power-transmitting electrodes 13, the reflected-power output is equal to the low power P1.

That is, in the present embodiment, the detection circuit 33 detects whether or not the generation of the high-frequency power by the high-frequency power generator 31 and the transmission of the high-frequency power at the power-transmitting electrodes 13 match each other (i.e., detects whether or not the impedance of the switchable matching device 32 matches the number of the moving bodies 11 having the respective power-receiving electrodes 14 actually opposed to and receiving the high-frequency power from the power-transmitting electrodes 13) by detecting the reflected-power output. Then, the detection circuit 33 outputs to the controller 34 the detected reflected-power output as the detection result thereof The controller 34 is configured with a microcomputer which includes a CPU (Central Processing Unit), a ROM (Read Only Memory), a RAM (Random Access Memory) and I/O (Input/Output) interfaces. The controller 34 controls the switchable matching device 32 in software through the execution of a program, which is installed in the ROM, by the CPU. Specifically, the controller 34 switches the matching circuits 42-44 of the switchable matching device 32 (i.e., controls the on/off switching of the switches 423, 433 and 443 of the matching circuits 42-44) on the basis of the reflected-power output detected by the detection circuit 33.

In addition, it should be noted that the controller 34 may alternatively be configured to control the switchable matching device 32 in combination of software and hardware.

Next, a process performed by the controller 34 for controlling the switchable matching device 32 will be described with reference to FIG. 8.

Upon start of the process, in step S101, the controller 34 sets the number of the moving bodies 11 having the respective power-receiving electrodes 14 actually opposed to and receiving the high-frequency power from the power-transmitting electrodes 13 to an initial value Num.

In addition, the initial value Num may be preset according to the total number of the moving bodies 11 that move along the track 16 and each have one pair of the power-receiving electrodes 14 provided therein for receiving the high-frequency power from the power-transmitting electrodes 13. More particularly, in the present embodiment, the total number of the moving bodies 11 is equal to 4. In this case, the initial value Num may be preset to 1 or 2.

In step S102, the controller 34 sets the impedance of the switchable matching device 32 to an initial value I(Num) that matches (or corresponds to) the initial value Num of the number of the moving bodies 11. More specifically, the controller 34 sets the impedance of the switchable matching device 32 to the initial value I(Num) by selectively turning on or off the switches 423, 433 and 443 of the matching circuits 42-44 of the switchable matching device 32.

In step S103, the controller 34 acquires the reflected-power output detected by the detection circuit 33.

In step S104, the controller 34 determines Whether the reflected-power output acquired in step S103 is equal to the low power P1.

If the determination in step S104 results in a "YES" answer, the process returns to step S103 to repeat steps S103 and S104.

Here, the reflected-power output detected by the detection circuit 33 is equal to the low power P1 when the impedance of the switchable matching device 32, which is set to the initial value I(Num) in step S102, matches the number of the moving bodies 11 having the respective power-receiving electrodes 14 actually opposed to and receiving the high-frequency power from the power-transmitting electrodes 13. Therefore, if the determination in step S104 results in a "YES" answer, the controller 34 determines that the matching circuits 42-44 of the switchable matching device 32 are suitably set to match the number of the moving bodies 11 having the respective power-receiving electrodes 14 actually opposed to and receiving the high-frequency power from the power-transmitting electrodes 13. Accordingly, in this case, the controller 34 maintains the current setting of the matching circuits 42-44 of the switchable matching device 32 and monitors the reflected-power output detected by the detection circuit 33 until a change occurs in the reflected-power output. For example, a change in the number of the moving bodies 11 present in the power-receiving region (i.e., the number of the moving bodies 11 having the respective power-receiving electrodes 14 actually opposed to and receiving the high-frequency power from the power-transmitting electrodes 13) causes reflected-power output detected by the detection circuit 33 to be changed.

On the other hand, if the determination in step S104 results in a "NO" answer, the process proceeds to step S105.

In step S105, the controller 34 changes the impedance of the switchable matching device 32 from the initial value I(Num) to a value I(Num+1) that matches (Num+1). Here. (Num+1) represents the number of the moving bodies 11 greater than the initial value Num by 1.

Specifically, if the determination in step S104 results in a "NO" answer, the controller 34 determines that the impedance of the switchable matching device 32, which is set to the initial value I(Num) in step S10, does not match the number of the moving bodies 11 having the respective power-receiving electrodes 14 actually opposed to and receiving the high-frequency power from the power-transmitting electrodes 13. Then, the controller 34 assumes that the number of the moving bodies 11 having the respective power-receiving electrodes 14 actually opposed to and receiving the high-frequency power from the power-transmitting electrodes 13 is equal to (Num+1). Based on this assumption, the controller 34 switches the matching circuits 42-44 of the switchable matching device 32, thereby changing the impedance of the switchable matching device 32 from the initial value I(Num) to the value I(Num+1) that matches (Num+1).

In step S106, the controller 34 again acquires the reflected-power output detected by the detection circuit 33.

In step S107, the controller 34 determines whether the reflected-power output acquired in step S106 is equal to the low power P1.

If the determination in step S107 results in a "YES" answer, the process proceeds to step S108.

In step S108, the controller 34 updates the initial value Num to (Num+1) (i.e., Num=Num+1). Then, the process returns to step S102 to repeat steps from S102 on.

Specifically, if the determination in step S107 results in a "YES" answer, the controller 34 determines that the number of the moving bodies 11 having the respective power-receiving electrodes 14 actually opposed to and receiving the high-frequency power from the power-transmitting electrodes 13 is equal to (Num+1), not the initial value NUM set in step S101. Therefore, the controller 34 updates the initial value Num to (Num+1) in step S108.

On the other hand, if the determination in step S107 results in a "NO" answer, the process proceeds to step S109.

in step S109, the controller 34 changes the impedance of the switchable matching device 32 to a value I(Num−1) that matches (Num−1). Here, (Num−1) represents the number of the moving bodies 11 less than the initial value Num by 1.

Specifically, if the determination in step S107 results in a "NO" answer, the controller 34 determines that the impedance of the switchable matching device 32 does not match the number of the moving bodies 11 having the respective power-receiving electrodes 14 actually opposed to and receiving the high-frequency power from the power-transmitting electrodes 13. Then, the controller 34 assumes that the number of the moving bodies 11 having the respective power-receiving electrodes 14 actually opposed to and receiving the high-frequency power from the power-transmitting electrodes 13 is equal to (Num−1). Based on this assumption, the controller 34 switches the matching circuits 42-44 of the switchable matching device 32, thereby changing the impedance of the switchable matching device 32 to the value I(Num−1) that matches (Num−1).

In step S110, the controller 34 again acquires the reflected-power output detected by the detection circuit 33.

In step S111, the controller 34 determines whether the reflected-power output acquired in step S 110 is equal to the low power P 1.

If the determination in step S111 results in a "YES" answer, the process proceeds to step S112.

In step S112, the controller 34 updates the initial value Num to (Num−1) (i.e., Num=Num−1). Then, the process returns to step S102 to repeat steps from S102 on.

Specifically, if the determination in step S111 results in a "YES" answer, the controller 34 determines that the number of the moving bodies 11 having the respective power-receiving electrodes 14 actually opposed to and receiving the high-frequency power from the power-transmitting electrodes 13 is equal to (Num−1), not the initial value Num set in step S101. Therefore, the controller 34 updates the initial value Num to (Num−1) in step S112.

On the other hand, if the determination in step S111 results in a "NO" answer, the process proceeds to step S113.

In step S113, the controller 34 stops the generation of the high-frequency power by the high-frequency power generator 31.

Specifically, the controller 34 determines that the initial value Num is not suitably preset or there is a failure (e.g., a short circuit) in the wireless power transmission apparatus 12 if the impedance of the switchable matching device 32 still does not match, after being changed to I(Num+1) in step S105 and to I(Num−1) in step S109, the number of the moving bodies 11 having the respective power-receiving electrodes 14 actually opposed to and receiving the high-frequency power from the power-transmitting electrodes 13. Therefore, in this case, the controller 34 stops the generation of the high-frequency power by the high-frequency power generator 31 and outputs a warning signal indicating the necessity of resetting the initial value Num or inspecting the wireless power transmission apparatus 12.

After step S113, the process terminates.

According to the present embodiment, it is possible to achieve the following advantageous effects.

In the present embodiment, the detection circuit 33 detects, based on the reflected-power output, whether or not the generation of the high-frequency power by the high-frequency power generator 31 and the transmission of the high-frequency power at the power-transmitting electrodes 13 match each other; the reflected-power output depends on the numberof the power-receiving electrodes 14 actually receiving the high-frequency power from the power-transmitting electrodes 13. The controller 34 switches the matching circuits 42-44 of the switchable matching device 32 (i.e., controls the on/off switching of the switches 423, 433 and 443 of the matching circuits 42-44) depending on the detection result of the detection circuit 33. Specifically, when the generation of the high-frequency power by the high-frequency power generator 31 and the transmission of the high-frequency power at the power-transmitting electrodes 13 match each other, the controller 34 determines that the matching circuits 42-44 of the switchable matching device 32 are suitably set; thus the controller 34 maintains the current setting of the matching circuits 42-44 of the switchable matching device 32. In contrast, when the generation of the high-frequency power by the high-frequency power generator 31 and the transmission of the high-frequency power at the power-transmitting electrodes 13 do not match each other, the controller 34 determines that the matching circuits 42-44 of the switchable matching device 32 are unsuitably set; thus, the controller 34 switches the matching circuits 42-44 of the switchable matching device 32 to have the generation of the high-frequency power by the high-frequency power generator 31 and the transmission of the high-frequency power at the power-transmitting electrodes 13 match each other. Consequently, it becomes possible to realize, without employing optical detection devices, automatic matching between the generation of the high-frequency power by the high-frequency power generator 31 and the transmission of the high-frequency power at the power-transmitting electrodes 13 (or automatic matching between the impedance of the switchable matching device 32 and the number of the power-receiving electrodes 14 actually receiving the high-frequency power from the power-transmitting electrodes 13), thereby improving the efficiency of the wireless power transmission from the power-transmitting electrodes 13 to the power-receiving electrodes 14.

Moreover, in the present embodiment, the switchable matching device 32 includes the matching circuits 42-44 having different impedances. When the generation of the high-frequency power by the high-frequency power generator 31 and the transmission of the high-frequency power at the power-transmitting electrodes 13 do not match each other, the controller 34 changes the impedance of the switchable matching device 32 stepwise by switching the electrical connection between the matching circuits 42-44 of the switchable matching device 32 and the power-transmitting electrodes 13. That is, the impedance of the switchable matching device 32 is changed on the power transmission side; no impedance-matching process is performed on the power reception side. Consequently, it becomes possible to realize, with the simple configuration, automatic impedance matching between the power transmission side and the power reception side even when each of the power-transmitting electrodes 13 transmits (or supplies) the high-frequency power to more than one power-receiving electrodes 14. In addition, compared to the case of continuously changing the impedance of the switchable matching device 32, it becomes possible to simplify the configuration of the switchable matching device 32 and facilitate the control of the switchable matching device 32 by the controller 34.

In the present embodiment, in the conveyance system 10 that employs the wireless power transmission apparatus 12, the number of the moving bodies 11 having the respective power-receiving electrodes 14 actually opposed to and receiving the high-frequency power from the power-transmitting electrodes 13 constantly changes. However, even in this case, it is still possible to realize automatic matching between the generation of the high-frequency power by the high-frequency power generator 31 and the transmission of the high-frequency power at the power-transmitting electrodes 13 (or automatic matching between the impedance of the switchable matching device 32 and the number of the power-receiving electrodes 14 actually receiving the high-frequency power from the power-transmitting electrodes 13) by switching the matching circuits 42-44 of the switchable matching device 32 on the basis of the reflected-power output detected by the detection circuit 33.

More specifically, in the conveyance system 10, the maximum number of the moving bodies 11 allowed to be present in the power-receiving region at the same time is an integer correlating with the length of each of the power-transmitting electrodes 13 and determined in advance; in the power-receiving region, the power-receiving electrodes 14 provided in the moving bodies 11 can receive the high-frequency power from the power-transmitting electrodes 13. Moreover, the number of the matching circuits of the switchable matching device 32 is set according to the maximum number of the moving bodies 11 allowed to be present in the power-receiving region at the same time. Consequently, though the number of the moving bodies 11 having the respective power-receiving electrodes 14 actually opposed to and receiving the high-frequency power from the power-transmitting electrodes 13 constantly changes, it is still possible to realize automatic matching between the generation of the high-frequency power by the high-frequency power generator 31 and the transmission of the high-frequency power at the power-transmitting electrodes 13 by switching the matching circuits 42-44 of the switchable matching device 32 on the basis of the reflected-power output detected by the detection circuit 33. As a result, it becomes possible to achieve safe and high-efficiency wireless power transmission without complicated configuration and processing.

Moreover, in the conveyance system 10, automatic matching between the generation of the high-frequency power by the high-frequency power generator 31 and the transmission of the high-frequency power at the power-transmitting electrodes 13 is realized without employing optical detection devices such as photo detectors. Consequently, it becomes possible to avoid false detection due to optical detection and thus mismatching due to the false detection. As a result, even if it is easy for movement of human bodies or physical objects to occur in the facility 15 where the conveyance system 10 is installed, it is still possible to achieve safe and high-efficiency wireless power transmission without being affected by the movement.

While the above particular embodiment has been shown and described, it will be understood by those skilled in the art that various modifications, changes, and improvements may be made without departing from the spirit of the present invention.

For example, in the above-described embodiment, when the generation of the high-frequency power by the high-frequency power generator 31 and the transmission of the high-frequency power at the power-transmitting electrodes 13 do not match each other(i.e., the determination in step S104 or S107 of the process shown in FIG. 8 results in a "NO" answer), the controller 34 switches the matching circuits 42-44 of the switchable matching device 32 (i.e., changes the impedance of the switchable matching device 32 in step S105 or S109 of the process shown in FIG. 8) without stopping the high-frequency power generator 31. Alternatively, the controller 34 may first stop the high-frequency power generator 31 (before step S105 or S109 of the process shown in FIG. 8), then switch the matching circuits 42-44 of the switchable matching device 32 (i.e., changes the impedance of the switchable matching device 32 in step S105 or S109), and thereafter restart the high-frequency power generator 31 (after step S105 or S109) In this case, it is possible to suppress occurrence of inrush current during a transient period in switching the matching circuits 42-44 of the switchable matching device 32, thereby improving the safety and durability of the wireless power transmission apparatus 12.

What is claimed is:

1. A wireless power transmission apparatus comprising:
   a high-frequency power generator configured to generate high-frequency power;
   a power-transmitting electrode configured to transmit the high-frequency power generated by the high-frequency power generator;
   a plurality of power-receiving electrodes each of which is capable of being opposed to the power-transmitting electrode and wirelessly receiving the high-frequency power from the power-transmitting electrode via electric field coupling using capacitance between the power-transmitting electrode and the power-receiving electrode;

a switchable matching device electrically connected with the power-transmitting electrode and including one or more matching circuits;

a detection circuit electrically connected between the high-frequency power generator and the switchable matching device to detect, based on output of reflected power from the power-transmitting electrode, whether or not the generation of the high-frequency power by the high-frequency power generator and the transmission of the high-frequency power at the power-transmitting electrode match each other, the reflected power being part of the high-frequency power which is not transmitted from the power-transmitting electrode to the power-receiving electrodes and returns from the power-transmitting electrode to the high-frequency power generator side, the output of the reflected power from the power-transmitting electrode depending on the number of the power-receiving electrodes actually opposed to and receiving the high-frequency power from the power-transmitting electrode; and a controller that controls, at least, operation of the high-frequency power generator and the switchable matching device, wherein the controller switches the one or more matching circuits of the switchable matching device depending on a detection result of the detection circuit.

2. The wireless power transmission apparatus as set forth in claim 1, wherein when the detection result of the detection circuit is that the generation of the high-frequency power by the high-frequency power generator and the transmission of the high-frequency power at the power-transmitting electrode do not match each other, the controller changes impedance of the switchable matching device stepwise by switching electrical connection between the one or more matching circuits of the switchable matching device and the power-transmitting electrode.

3. The wireless power transmission apparatus as set forth in claim 2, wherein when the detection result of the detection circuit is that the generation of the high-frequency power by the high-frequency power generator and the transmission of the high-frequency power at the power-transmitting electrode do not snatch each other, the controller first stops the high-frequency power generator, then switches the electrical connection between the one or more matching circuits of the switchable matching device and the power-transmitting electrode, and thereafter restarts the high-frequency power generator.

4. A conveyance system comprising:
the wireless power transmission apparatus as set forth in claim 1; and
a plurality of moving bodies each of which has one of the power-receiving electrodes of the wireless power transmission apparatus provided therein, wherein the power-transmitting electrode of the wireless power transmission apparatus is plate-shaped and provided in part of a track along which the moving bodies move, and the output of the reflected power from the power-transmitting electrode changes depending on the number of the moving bodies having the respective power-receiving electrodes actually opposed to and receiving the high-frequency power from the power-transmitting electrode.

5. A method of controlling a wireless power transmission apparatus, wherein the wireless power transmission apparatus comprises:

a high-frequency power generator configured to generate high-frequency power;

a power-transmitting electrode configured to transmit the high-frequency power generated by the high-frequency power generator;

a plurality of power-receiving electrodes each of which is capable of being opposed to the power-transmitting electrode and wirelessly receiving the high-frequency power from the power-transmitting electrode via electric field coupling using capacitance between the power-transmitting electrode and the power-receiving electrode, each of the power-receiving electrodes being provided in one of a plurality of moving bodies; and a switchable matching device electrically connected with the power-transmitting electrode and including one or more matching circuits, the method comprising the steps of:

setting the number of the moving bodies having the respective power-receiving electrodes actually opposed to and receiving the high-frequency power from the power-transmitting electrode to an initial value;

setting impedance of the switchable matching device according to the initial value by setting the one or more matching circuits of the switchable matching device;

detecting whether or not the generation of the high-frequency power by the high-frequency power generator and the transmission of the high-frequency power at the power-transmitting electrode match each other;

changing the initial value when the generation of the high-frequency power by the high-frequency power generator and the transmission of the high-frequency power at the power-transmitting electrode do not match each other; and stopping the high-frequency power generator when the generation of the high-frequency power by the high-frequency power generator and the transmission of the high-frequency power at the power-transmitting electrode still do not match each other after the changing of the initial value.

* * * * *